(12) United States Patent
Kattner et al.

(10) Patent No.: US 6,911,863 B2
(45) Date of Patent: Jun. 28, 2005

(54) INTEGRATED DVB FILTER

(75) Inventors: Axel Kattner, Seevetal (DE); Holger Moll, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/476,968

(22) PCT Filed: May 8, 2002

(86) PCT No.: PCT/IB02/01614

§ 371 (c)(1),
(2), (4) Date: Nov. 6, 2003

(87) PCT Pub. No.: WO02/093742

PCT Pub. Date: Nov. 21, 2002

(65) Prior Publication Data

US 2004/0145682 A1 Jul. 29, 2004

(30) Foreign Application Priority Data

May 11, 2001 (DE) .......................................... 101 22 831

(51) Int. Cl.[7] ............................................... H03K 5/00
(52) U.S. Cl. ........................................ 327/553; 327/552
(58) Field of Search ................................. 320/551–559

(56) References Cited

U.S. PATENT DOCUMENTS

| | | | | |
|---|---|---|---|---|
| 4,812,771 A | * | 3/1989 | Lauper et al. | 327/552 |
| 4,818,903 A | * | 4/1989 | Kawano | 327/553 |
| 5,351,091 A | * | 9/1994 | Hosoya et al. | 348/505 |
| 5,442,130 A | * | 8/1995 | Kitayama et al. | 84/661 |
| 5,572,163 A | * | 11/1996 | Kimura et al. | 327/553 |
| 5,745,001 A | * | 4/1998 | Ueshima et al. | 327/553 |
| 5,864,442 A | * | 1/1999 | Naito | 360/65 |
| 6,114,902 A | * | 9/2000 | Beatson et al. | 327/553 |

* cited by examiner

Primary Examiner—Dinh T. Le
(74) Attorney, Agent, or Firm—Michael J. Ure

(57) ABSTRACT

A filter for processing frequency signals, preferably received, particularly digital television signals is described, which filter comprises a Chebyshev filter (11, 12), a subsequent all-pass filter (13) and a control device (14 to 20) for controlling the Chebyshev filter (11, 12) and the all-pass filter (13).

12 Claims, 2 Drawing Sheets

Standard - dependent frequency response
and group delay time

| standard | lower limit frequency $f_u$ [ MHz ] | channel bandwidth BW [ MHz ] | picture carrier frequency |
|---|---|---|---|
| M / N | 1 | 6 | $f_u$ + MW + 4.75MHz |
| B | 1 | 7 | $f_u$ + MW + 5.75MHz |
| G, L, I, D / K | 1 | 8 | $f_u$ + MW + 6.75MHz |

Standard dependent picture carrier frequency

INTEGRATED DVB FILTER

The invention relates to a filter for processing frequency signals, preferably received, particularly digital television signals.

A main field of application of such a filter is, for example, its use in digital video broadcast (DVB) systems with mainly radio frequency (RF) and intermediate frequency (IF) stages at the receiver front end such as, for example, a DVB receiver, a set top box or a video card built in a personal computer.

Only an external application for each television standard with different elements or a fixed application having different selection properties for each standard has hitherto been available.

To maintain the DVB specification, a maximum amplitude ripple of less than 0.6 dB and a maximum group delay time ripple of less than 100 ns are allowed in the pass band. The adjacent picture carrier (standard-dependent frequency) should be attenuated by at least 20 dB. To be able to digitize the DVB signal, A/D converters with a sampling rate of 30 MHz are used in the state of the art. To avoid aliasing effects, frequency components of more than 15 MHz and 20 dB must be attenuated.

The known solutions require, however, an elaborate configuration as well as an equalization, which leads to a complicated and costly implementation.

It is an object of the present invention to replace the above-described and elaborate external applications by a fully integrated configuration which is free from equalization and suitable for multi-standard use, in which a standard-dependent bandwidth of the passband and the desired selection properties for maintaining the DVB specifications is ensured.

This object is achieved in that a Chebyshev filter, a subsequent all-pass filter and a control device for controlling the Chebyshev filter, and the all-pass filter are provided in a filter of the type described in the opening paragraph.

The invention allows full implementation in an integrated circuit while using a comparatively small number of components, so that an external application will be superfluous. Furthermore, the configuration according to the invention does not require any equalization. By switching the frequency by means of the control device provided in accordance with the invention, the bandwidth can be adjusted in dependence upon the selected transmission system standard. Finally, the invention provides an optimum between a proportionally large suppression of the adjacent channel picture carrier, a proportionally large suppression of the aliasing components for an A/D conversion, a flat group delay time in the passband and a proportionally small amplitude fluctuation in the passband.

An integrated filter with a small amplitude and group delay time ripple in the passband, which is switchable in dependence upon the standard, can thus be realized by means of the invention.

The invention is particularly suitable for use in DVB systems in which the DVB signal should preferably be converted in such a way that the lower band limit for all standards is 1 MHz.

The Chebyshev filter is preferably a higher-order Chebyshev filter. A $4^{th}$-order Chebyshev filter has proved to be very advantageous.

Furthermore, the Chebyshev filter may comprise a plurality of filter stages. The use of two filter stages has proved to be very advantageous, with each filter stage being preferably formed as a $2^{nd}$-order filter stage.

The Chebyshev filters should suitably have a ripple of less than 0.5 dB so that a very effective suppression of the disturbing frequency components in the DVB signal can be realized.

Furthermore, the all-pass filter should be implemented as a higher-order all-pass filter, with a $2^{nd}$-order all-pass filter having proved to be very advantageous.

The all-pass filter should suitably smooth the group delay time ripple produced in the passband to a value of less than 75 ns.

The control device preferably comprises a frequency synthesizer so that the frequency can be very exactly switched and adjusted in dependence upon the selected standard.

An improvement of the embodiment of the invention described above, which is currently preferred, is characterized in that the frequency synthesizer generates a reference signal at a reference frequency and the control device further comprises a reference low-pass filter which shifts the phase of the reference signal by 90°, and a phase detector which compares the phase positions of the reference signal and the output signal of the reference low-pass filter and generates an output signal for controlling the frequency position of the Chebyshev filter, the all-pass filter and the reference low-pass filter. Such a circuit is particularly also used for eliminating disturbing temperature influences and process spreads in the control signal of the control device. A capacitor which is charged or discharged by the differential current at the output of the phase detector may be connected to the output of this phase detector. Finally, a buffer memory may be connected to the output of the phase detector, through which buffer memory the output signal of the phase detector is passed.

These and other aspects of the invention are apparent from and will be elucidated with reference to the embodiments described hereinafter.

Figure 1:
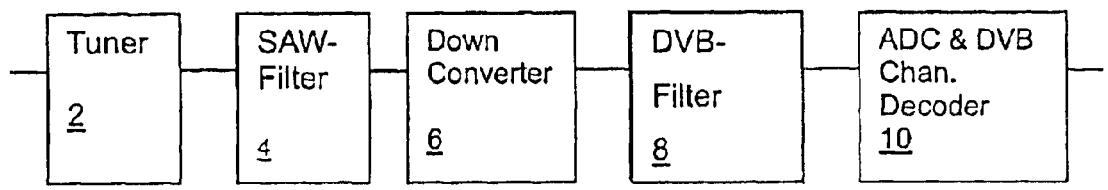
FIG. 1 is a block diagram of a circuit arrangement comprising a tuner, a surface acoustic wave filter, a down-converter, a DVB filter and a common A/D converter and DVB channel decoder.

FIG. 1 is a block diagram of a part of a DVB receiver in which a DVB filter is used. The circuit arrangement shown comprises a tuner 2 which converts a radio frequency (RF) input signal into an intermediate frequency (IF) signal which is smoothed in a subsequent surface acoustic wave filter 4. Subsequently, the IF signal thus smoothed is applied to a down-converter 6 in which a frequency conversion takes place. The output signal of the down-converter 6 passes through a DVB filter 8 before it is further processed in a common A/D converter and DVB channel decoder 10.

Figure 2:
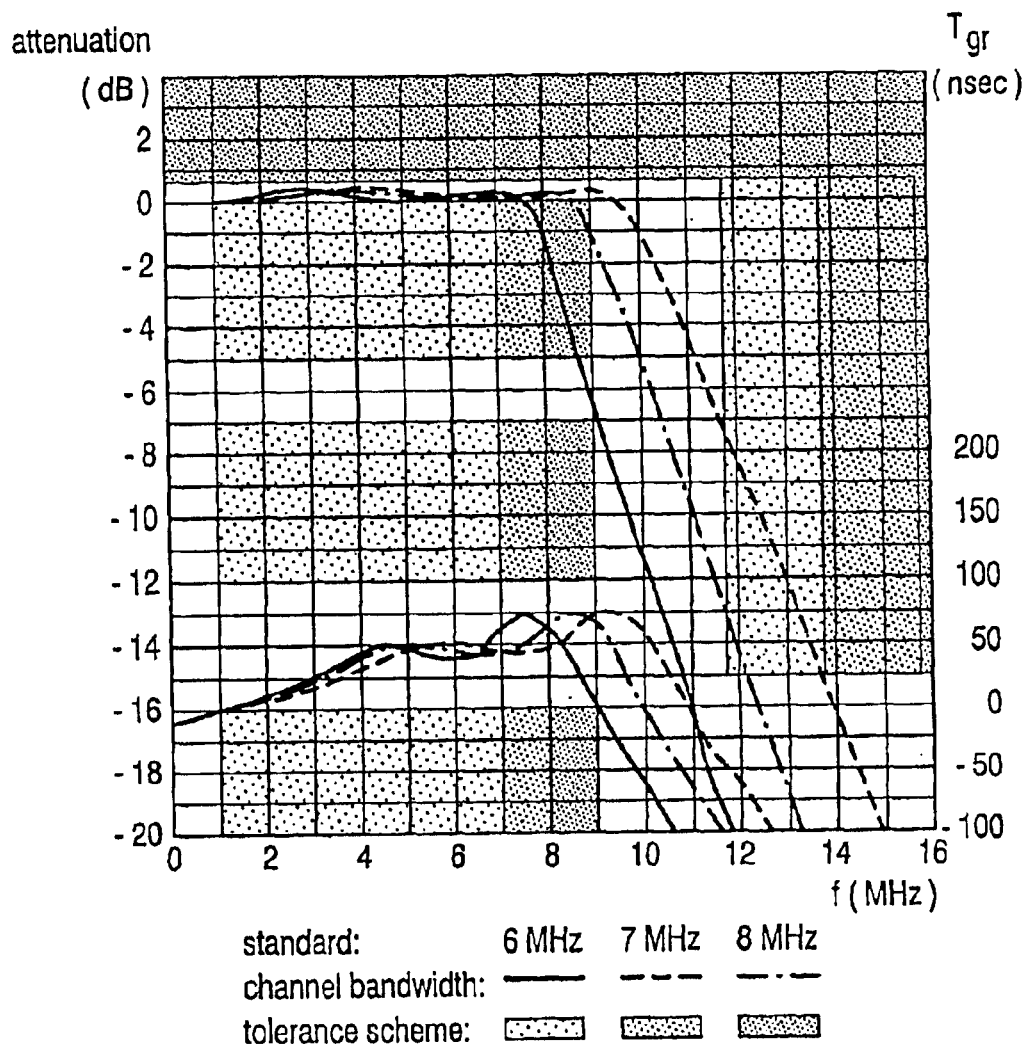
FIG. 2 is a diagram and a table illustrating standard-dependent frequency responses and group delay times as well as picture carrier frequencies.

FIG. 2 is a diagram illustrating standard-dependent frequency responses and group delay times, as well as a table illustrating standard-dependent picture carrier frequencies with respect to different DVB television standards. A digital transmitter is to receive and the strong carriers of an analog adjacent channel are to be suppressed. To maintain the DVB specification, of which the diagram and the table of FIG. 2 form part, a maximum amplitude ripple of less than 0.6 dB and a maximum group delay time ripple of less than 100 ns is admissible in the passband. The adjacent picture carrier (with standard-dependent frequency) should be attenuated by at least 20 dB. To be able to digitize the DVB signal, A/D converters with a sampling rate of 30 MHz are generally used. To avoid aliasing effects, frequency components of more than 15 MHz should be attenuated by 20 dB. In the embodiment shown in FIG. 1, the DVB signal is converted in such a way that the lower band limit for all standards is 1 MHz.

Figure 3:
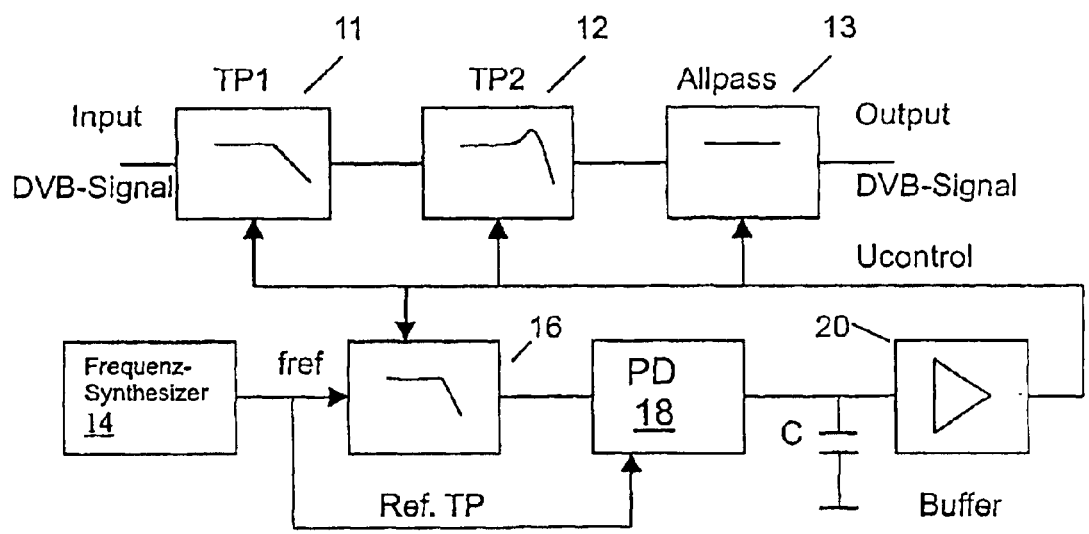
FIG. 3 is a preferred embodiment of a filter according to the invention.

FIG. 3 shows an embodiment of the DVB filter 8 of FIG. 1.

The DVB filter 8 whose input conveys the DVB signal, which is an output signal from the down-converter 6, comprises a $4^{th}$-order Chebyshev filter which, in the embodiment shown, consists of a first $2^{nd}$-order filter (TP1) 11 with a nominal (BW=7 MHz) terminal frequency fq1=5.15 MHz and a Q factor Q1=0.71, and a second $2^{nd}$-filter (TP2) 12 with a nominal terminal frequency fq2=8.95 MHz and a Q factor Q2=2.9.

The two filters 11 and 12 arranged in series or in cascade precede an all-pass filter 13 which consists in the embodiment shown of a $2^{nd}$-order all-pass filter with a nominal terminal frequency fq3=6.5 MHz and a Q factor Q3=0.9. The group delay time ripple of the Chebyshev filter 11, 12 is smoothed by means of this all-pass filter 13.

The Chebyshev filter 11, 12 has a ripple of less than 0.5 dB so as to suppress the interfering frequency components in the DVB signal. The group delay time ripple produced in the passband is smoothed to less than 75 ns by the all-pass filter 13 (see FIG. 2).

As is further apparent from FIG. 3, a frequency synthesizer 14 is provided, which generates a reference signal at a reference frequency fref, which reference signal is applied to a reference low-pass filter 16 and a phase detector (PD) 18. The reference low-pass filter 16 shifts the phase of the reference signal nominally by 90°. The phase detector 18 compares the two phase positions and generates a differential current at its output, which differential current charges or discharges a capacitor C. The voltage Ucontrol thus formed at the capacitor C is passed through a buffer 20 and is used as a control voltage with which the frequency position of the reference low-pass filter 16, the filters 11 and 12 and the all-pass filter 13 is controlled. The phase detector 18 changes the control voltage Ucontrol via its current output and thus changes the filter frequencies as long as the phase difference between its input signals is 90°.

The circuit components 14 to 20 described hereinbefore constitute a control device for controlling the filters 11 and 12, and the all-pass filter 13. The standard switching is performed by switching the reference frequency fref of the frequency synthesizer 14. The phase detector 18 thereby controls the filters 11 and 12 and the all-pass filter 13 at the desired reference frequency. Furthermore, the control described hereinbefore serves for eliminating unwanted temperature influences and process spreads so as to maintain the control voltage Ucontrol at the desired value.

What is claimed is:

1. A filter for processing frequency signals, comprising a Chebyshev filter (11, 12), a subsequent all-pass filter (13) producing an output signal and a control device (14 to 20) comprising a frequency synthesizer (14) producing a controllable reference frequency for controlling the Chebyshev filter (11, 12) and the all-pass filter (13), wherein the frequency synthesizer (14) generates a reference signal at a reference frequency (fref), and the control device further comprises a reference low-pass filter (16) which shifts the phase of the reference signal by 90 degrees, and a phase detector (18) which compares the phase positions of the reference signal and the output signal of the reference low-pass filter (16) and generates an output signal for controlling the frequency position of the Chebyshev filter (11, 12), the all-pass filter (13) and the reference low-pass filter (16).

2. A filter as claimed in claim 1, wherein the Chebyshev filter (11, 12) is a higher-order Chebyshev filter.

3. A filter as claimed in claim 2, wherein the Chebyshev filter (11, 12) is a 4th-order Chebyshev filter.

4. A filter as claimed in claim 1, wherein the Chebyshev filter comprises a plurality of filter stages (11, 12).

5. A filter as claimed in claim 4, wherein the Chebyshev filter comprises two filter stages (11, 12).

6. A filter as claimed in claim 3, wherein each filter stage (11, 12) is a 2nd-order filter stage.

7. A filter as claimed in claim 1, wherein the Chebyshev filter (11, 12) has a ripple of less than 0.5 dB.

8. A filter as claimed in claim 1, wherein the all-pass filter (13) is a higher-order all-pass filter.

9. A filter as claimed in claim 8, wherein the all-pass filter (13) is a 2nd-order all-pass filter.

10. A filter as claimed in claim 1, wherein the all-pass filter (13) smoothes the group delay time ripple produced in the passband to a value of less than 75 ns.

11. A filter as claimed in claim 1, comprising a capacitor (C) connected to the output of the phase detector (18).

12. A filter as claimed in claim 1, comprising a buffer (20) connected to an output of the phase detector (18), through which buffer the output signal of the phase detector (18) is passed.

* * * * *